United States Patent
Carobolante

(10) Patent No.: US 6,603,361 B1
(45) Date of Patent: *Aug. 5, 2003

(54) METHOD AND APPARATUS FOR MAINTAINING CLOCK ACCURACY AT POWER DOWN

(75) Inventor: Francesco Carobolante, Scotts Valley Santa Cruz, CA (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/476,220

(22) Filed: Dec. 30, 1999

(51) Int. Cl.[7] .............................. H03L 7/08; H03L 7/099
(52) U.S. Cl. ......................... 331/25; 327/156; 327/159; 360/51
(58) Field of Search ...................... 331/14, 25; 327/147, 327/150, 156, 159; 318/607, 608; 713/322; 360/51

(56) References Cited

U.S. PATENT DOCUMENTS

| | | | | |
|---|---|---|---|---|
| 4,521,918 A | * | 6/1985 | Challen ........................ | 331/17 |
| 5,373,254 A | * | 12/1994 | Nakauchi et al. .............. | 331/14 |
| 5,543,697 A | * | 8/1996 | Carobolante et al. ....... | 318/594 |
| 5,935,253 A | * | 8/1999 | Conary et al. .............. | 713/322 |
| 5,994,866 A | * | 11/1999 | Kisaka et al. ................ | 318/607 |

* cited by examiner

*Primary Examiner*—David C. Mis
(74) *Attorney, Agent, or Firm*—Lisa K. Jorgenson; James H. Morris

(57) ABSTRACT

A circuit that synchronizes an output clock signal to a second clock signal includes a frequency locked loop circuit that receives the output clock signal and the second clock signal, modifies a frequency of the output clock signal in response to a difference in frequency between the output signal clock signal and the second clock signal to provide an output clock signal having a frequency within a predetermined error band of the frequency of the second clock signal and wherein the frequency locked loop continues to provide the output clock signal in the absence of the second clock signal.

22 Claims, 5 Drawing Sheets

METHOD AND APPARATUS FOR MAINTAINING CLOCK ACCURACY AT POWER DOWN

BACKGROUND OF THE INVENTION

1. Field of the Invention

The present invention relates generally to clocking circuits. More particularly, the present invention relates to a clocking circuit that maintains clock accuracy at power down.

2. Discussion of the Related Art

In various electrical devices, reference clock signals are needed to clock digital circuits inside integrated circuits. One example of this type of circuit is in a motor controller that is used to control, for example, a hard disk drive. In such a motor controller, when the power supply is providing power to the controller, a reference clock is typically available to the integrated circuit from an external reference clock generator, such as a quartz oscillator based clock. However, once the power to the hard disk drive and associated control circuitry is shut off, as during power down, the motor controller is required to continue to operate in order to properly protect, for example, the actuator of the hard disk drive. In order for the motor controller to continue operating properly, certain timer circuits need to accurately maintain their operation during the power down sequence. To provide the energy necessary to operate the motor controller and associated timer circuits during the power down sequence, the back EMF of the spinning hard disk drive motor may be rectified. Although this provides power to the motor controller, since the main power supply is no longer operating, the reference clock generator is not operative and therefore the clock signal needed to operate the timer circuits has to be obtained in another way.

Conventionally, R/C (Resistor/capacitor) oscillators are used to provide a clock signal during the power down sequence. However, more stringent requirements on the accuracy of the clock frequency required by modem circuits would require complex trimming and thermal calibration. The added expense associated with trimming and calibration makes this solution undesirable.

Another alternative would be to provide an additional quartz oscillator powered by the rectified energy of the spinning motor. However, this solution would add additional expense that would be considered undesirable in certain applications.

Therefore, an object of the present invention is to provide a method and apparatus that overcomes at least these problems.

SUMMARY OF THE INVENTION

The present invention overcomes at least the foregoing problems by providing a circuit that synchronizes an output clock signal to a second clock signal, the circuit including a frequency locked loop that receives the output clock signal and the second clock signal, modifies a frequency of the output clock signal in response to a difference in frequency between the output clock signal and the second clock signal to provide an output clock signal having a frequency within a predetermined error band of the frequency of the second clock signal and wherein the frequency locked loop continues to provide the output clock signal in the absence of the second clock signal. During a power down sequence, the frequency of the output clock signal does not vary, but remains at the frequency last locked to by the frequency locked loop.

According to one embodiment of the invention, the second clock signal is provided by a quartz crystal oscillator.

According to one embodiment of the invention, a first clock signal is provided by a resistor/capacitor oscillator circuit.

According to another embodiment of the invention, the frequency locked loop circuit includes a frequency discriminator and a controlled signal generator.

According to another embodiment of the invention, the frequency discriminator compares the frequency of the second clock signal with the frequency of the output clock signal and provides a signal indicative of the difference between the frequency of the second clock signal and the frequency of the output clock signal.

According to another embodiment of the invention, the controlled signal generator responds to the frequency discriminator to increase the frequency of the output clock signal if the frequency of the second clock signal is greater than the frequency of the output clock signal.

According to another embodiment of the invention, the controlled signal generator responds to the frequency discriminator to decrease the frequency of the output clock signal if the frequency of the second clock signal is less than the frequency of the output clock signal.

According to another embodiment of the invention, the controlled signal generator includes at least one counter.

According to another embodiment of the invention, the at least one counter includes a down counter and a saturated up/down counter.

According to an embodiment of the invention, the at least one counter includes a counter and an up/down counter.

According to another embodiment of the invention, the predetermined error band is less than or equal to one percent of the frequency of the second clock signal.

According to another embodiment of the invention, the circuit is incorporated into a motor controller for a hard disk drive.

According to another embodiment of the invention, the quartz crystal oscillator is powered by a first power supply and wherein the frequency locked loop continues to provide the output clock signal when the first power supply no longer operates.

According to another embodiment of the invention, a method of synchronizing an output clock signal to a second clock signal is provided, the method comprising the steps of receiving an output clock signal, receiving a second clock signal, comparing a frequency of the second clock signal to a frequency of the output clock signal, modifying a frequency of the output clock signal in response to the comparing step and providing an output clock signal having a frequency within a predetermined error band of the frequency of the second clock signal, and continuing to provide the output clock signal in the absence of the second clock signal.

According to another embodiment, the method further comprises the step of increasing the frequency of the output clock signal if the frequency of the second clock signal is greater than the frequency of the output clock signal.

According to another embodiment of the invention, the method further comprises the step of decreasing the frequency of the output clock signal if the frequency of the second clock signal is less than the frequency of the output clock signal.

BRIEF DESCRIPTION OF THE DRAWINGS

In the drawings, which are incorporated herein by reference and in which like elements have been given like reference characters.

DETAILED DESCRIPTION

Figure 1:
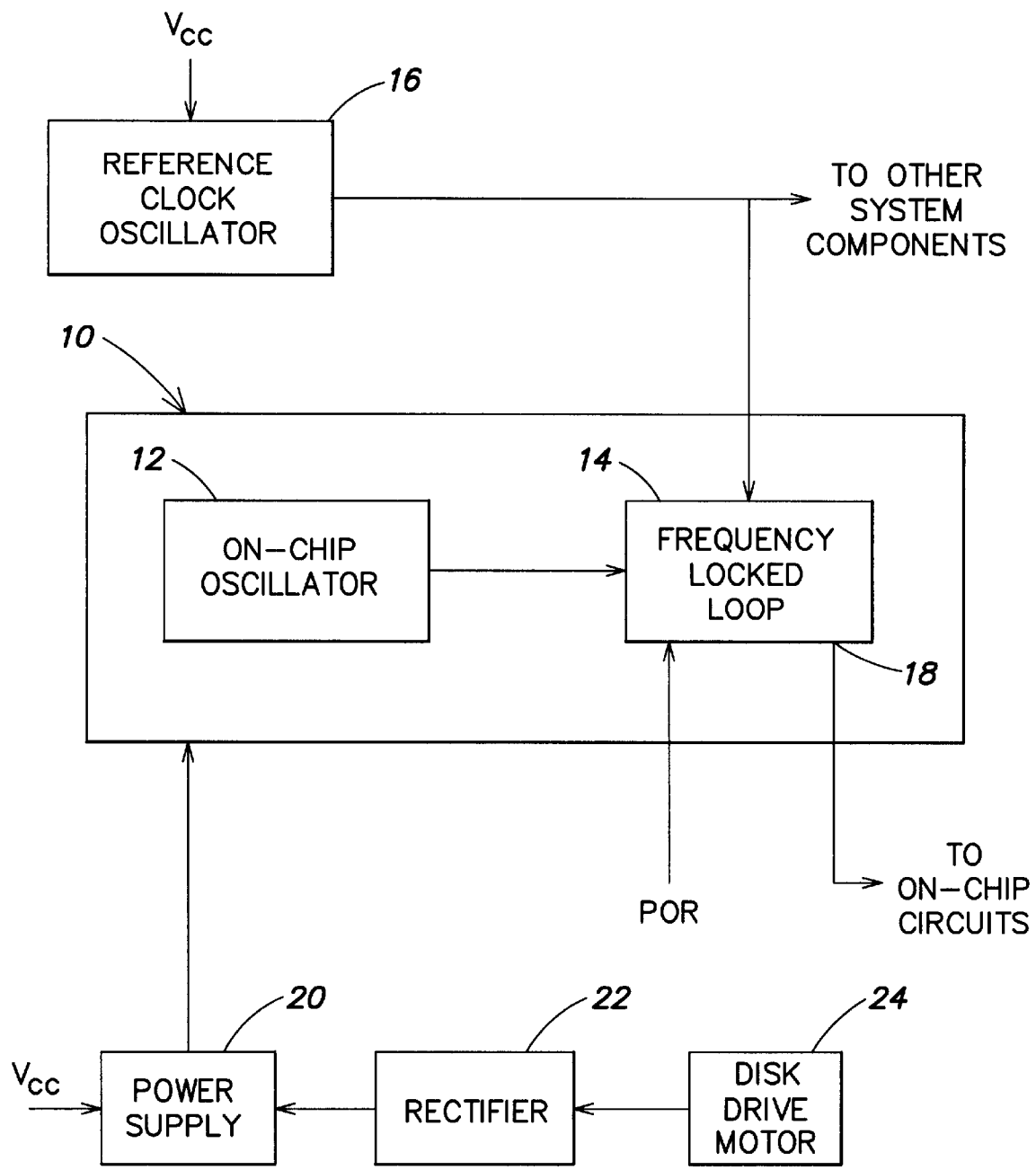
FIG. 1 illustrates a first embodiment of the invention.

FIG. 1 illustrates one embodiment of the invention. A clock generator circuit 10 is provided as part of the integrated circuit. Clock generator 10 includes an on-chip oscillator 12 that supplies a clock signal to frequency locked loop 14. On-chip oscillator 12 may be a resistor/capacitor or R/C type oscillator circuit.

Frequency locked loop 14 receives a reference clock signal from reference clock oscillator 16. Reference clock oscillator 16 also provides a clock signal to other system components. Reference clock oscillator 16 receives power from the VCC system power supply.

Frequency locked loop 14 provides a clock signal on output 18 by modifying the frequency of the clock signal provided by on-chip oscillator 12 as a function of the clock frequency provided by reference clock oscillator 16. The output clock frequency provided on output 18 is sent to other on-chip circuits within the integrated circuit. Frequency locked loop 14 also receives a power on reset signal POR.

One application of the circuit illustrated in FIG. 1 is for use as a clock generator within a motor controller circuit of a hard disk drive. During normal operation, power supply 20 selects power source VCC and supplies this power source to clock generator 10. However, when VCC is shut off the circuit enters a power down mode in which rectifier 22 rectifies the back EMF provided by disk drive motor 24 as it spins down and provides this energy to internal clock generator 10. Internal clock generator 10 uses this energy to continue to provide a clock on output 18 to on-chip circuits, such as timer circuits, that allow the disk drive to properly park the heads, locate the actuator, and otherwise proceed through an orderly shut down process.

Frequency locked loop 14, during normal operation, when VCC is present, monitors the difference between the frequency of the clock signal provided by reference clock oscillator 16 and the frequency of the clock signal provided by on-chip oscillator 12. Frequency locked loop 14 receives as an input the clock frequency provided by on-chip oscillator 12 and changes the clock frequency so that the clock frequency provided on output 18 is locked to the frequency of reference clock oscillator 16 or within some predetermined error band or tolerance of this target clock frequency. When the circuit goes into power down mode and power is being supplied by rectifier 22, reference clock oscillator 16 is no longer generating a clock frequency and power on reset signal POR is asserted. In this mode, frequency locked loop 14 continues to supply a clock signal on output 18 having a frequency equal to the last frequency locked to before reference clock oscillator 16 stopped generating a clock signal. Clock generator circuit 10 continues to supply the clock signal on output 18 until the power provided by rectification of the back EMF of disk drive motor 24 is exhausted. The time necessary for the clock signal to be provided on output 18 is typically less than one second.

As noted previously, on-chip oscillator 12 may be an R/C type oscillator. R/C type oscillators may be subject to drift due to component variations and temperature changes. However, since frequency locked loop 14 is always adjusting the frequency of the clock signal provided on output 18 to lock the frequency of the clock signal to the frequency of the clock signal provided by reference oscillator 16, any variations in the clock frequency provided by on-chip oscillator 12 are compensated for. Thus, the circuit of FIG. 1 provides an inexpensive, easily integrable way of providing an accurate clock signal when VCC is shut off for the time necessary to ensure an orderly shut down of the on-chip circuits that depend upon the clock signal provided on output 18.

Figure 2:
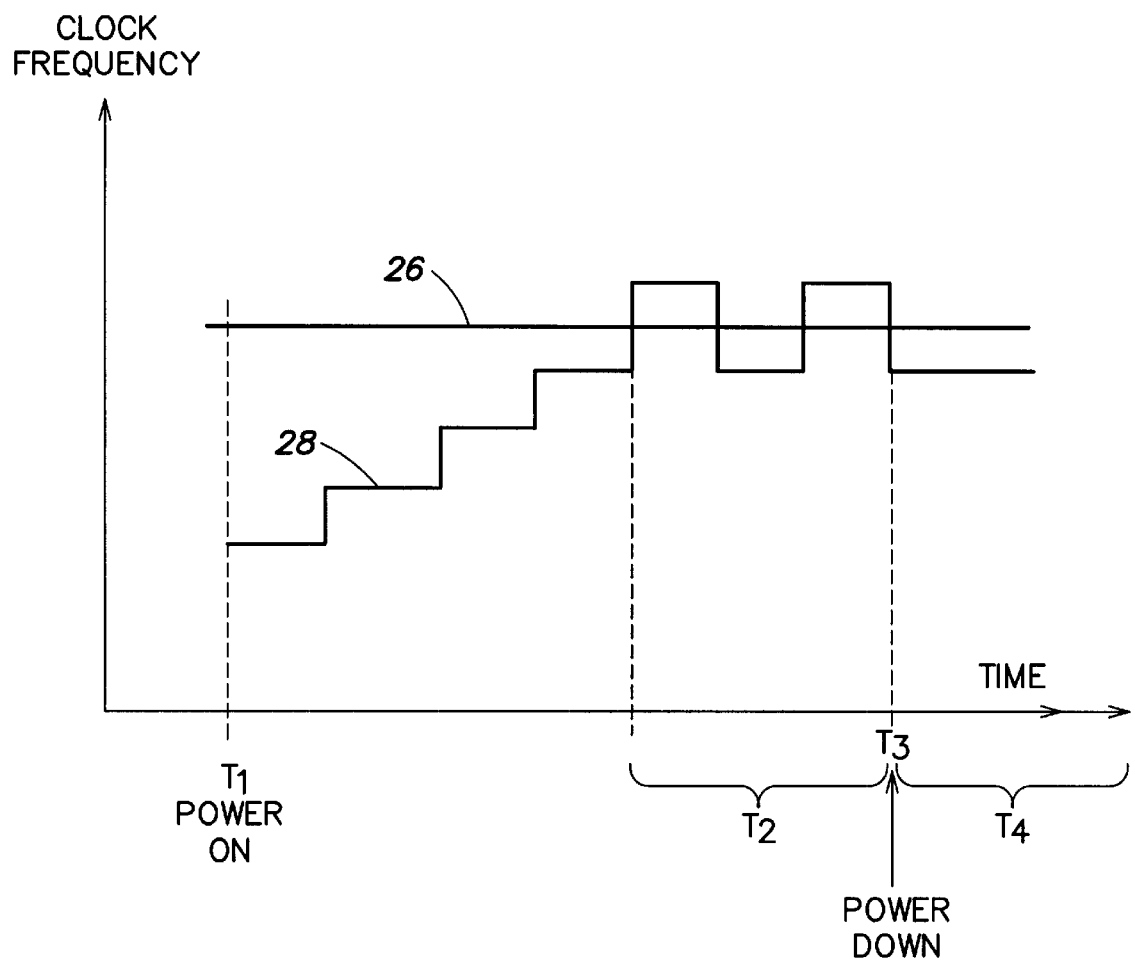
FIG. 2 is a graph illustrating convergence of the output clock signal and the reference clock signal in accordance with the operation of the circuit of FIG. 1.

FIG. 2 illustrates the operation of the circuit of FIG. 1. FIG. 2 is a graph of clock frequency versus time. The reference clock frequency generated by reference clock oscillator 16 is represented by line 26 having a constant frequency. The clock signal provided on output 18 by frequency locked loop 14 is illustrated by line 28. At a time prior to time T1, no power is supplied to the circuit so clock signal 26 and 28 are not being generated. At time T1, power to the circuit is turned on and reference clock oscillator 16 generates reference clock frequency 26. At time T1 (typically corresponding to the POR signal going high), frequency locked loop 14 begins comparing the clock signal frequency provided on output 18 with the frequency of the clock signal provided by reference clock oscillator 16 and begins adjusting the frequency of the clock signal provided on output 18 so as to converge the two frequencies. During time interval T2, the frequency of the clock signal provided on output 18 has been locked to the frequency of reference clock signal 26 within the error band or tolerance provided by the circuit. At time T3, the circuit enters a power down sequence and the last frequency of the clock signal provided on output 18 is maintained during time interval T4. Time interval T4 lasts until the voltage provided by power supply 20 from rectifier 22 drops below a level at which the circuit can operate.

Figure 3:
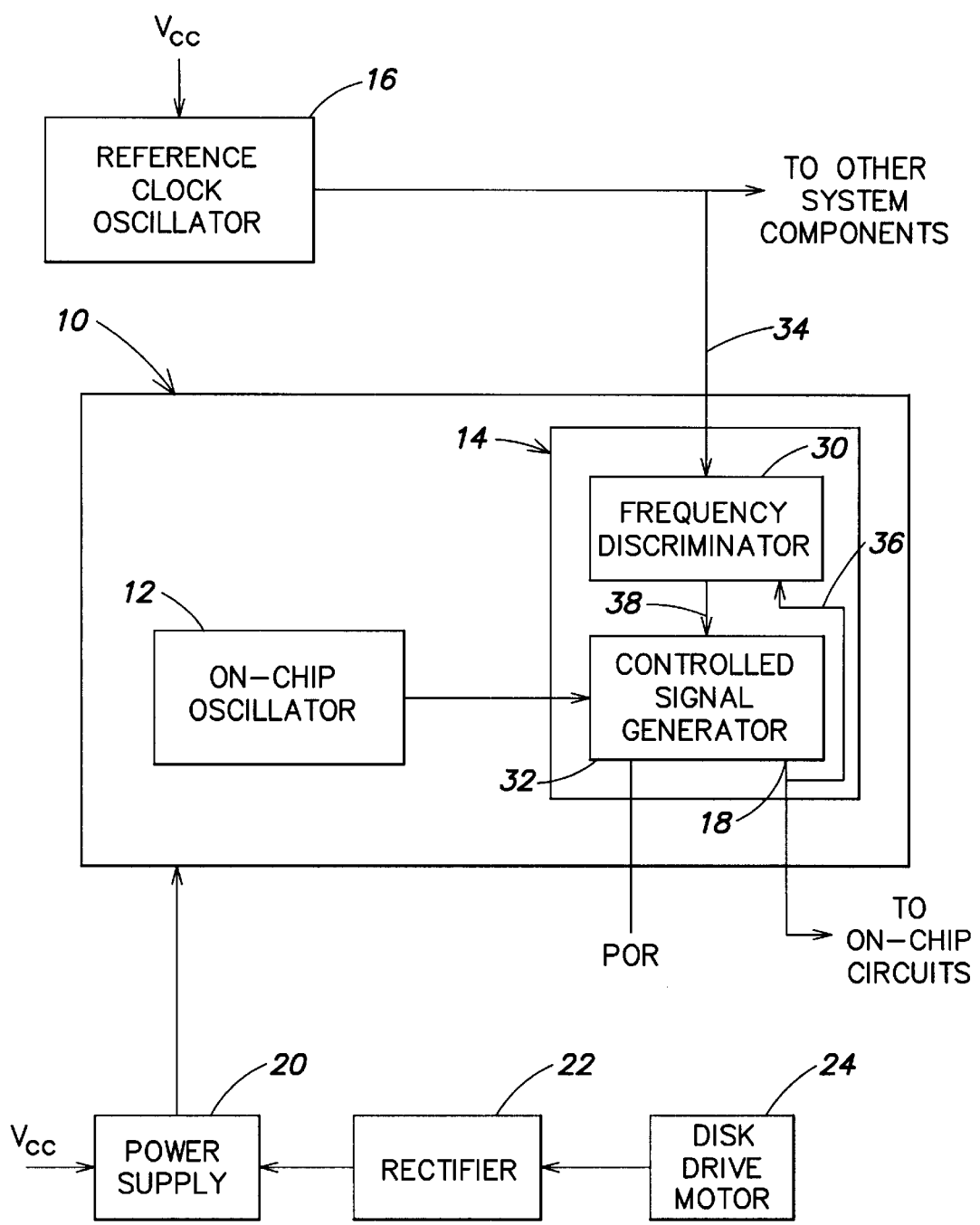
FIG. 3 illustrates, in more detail the frequency locked loop illustrated in FIG. 1.

FIG. 3 illustrates a more detailed embodiment of the circuit of FIG. 1. In particular, FIG. 3 illustrates one embodiment of frequency locked loop 14. As illustrated in FIG. 3, frequency locked loop 14 includes a frequency discriminator 30 and a controlled signal generator 32. Frequency discriminator 30 compares the frequency of reference clock signal 26 provided on line 34 with the frequency of the clock signal provided on output 18 which is provided to frequency discriminator 30 on line 36. When frequency discriminator 30 detects a difference between the frequency on line 34 and the frequency on line 36, frequency discriminator 30 provides a control signal on line 38 to controlled signal generator 32. In response to this control signal, controlled signal generator 32 modifies the frequency of the clock signal provided on output 18 so that this frequency converges to the frequency of reference clock signal 26.

Figure 4:
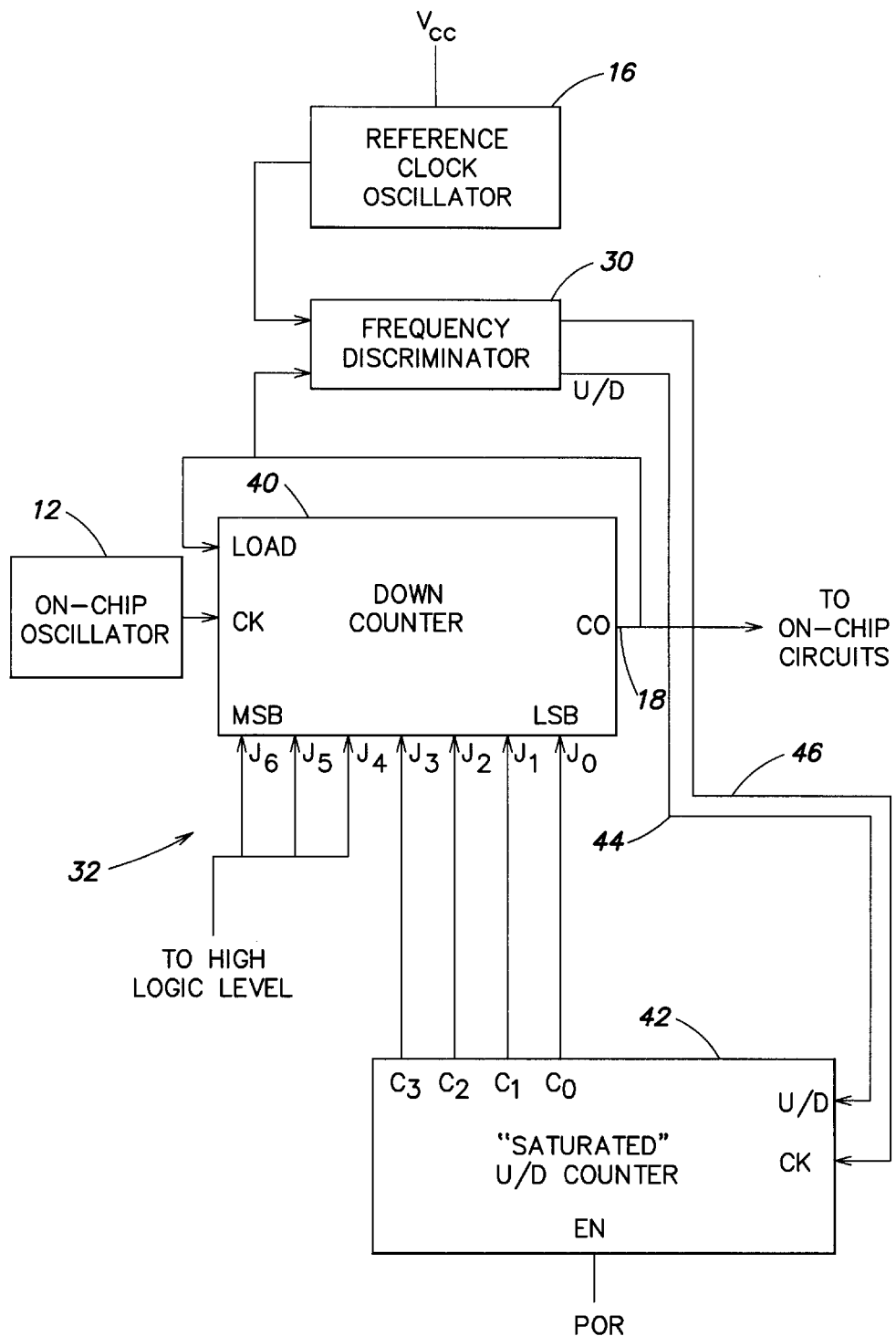
FIG. 4 illustrates a more detailed embodiment of the controlled signal generator of FIG. 3.

Reference is now made to FIG. 4, which figure illustrates one embodiment of controlled signal generator 32. In the circuit of FIG. 4, controlled signal generator 32 includes a down counter 40 and an up/down counter 42.

In the embodiment illustrated in FIG. 4, down counter 40 is an eight bit counter. The four most significant bits of down counter 40 are preset to a high logic level by, for example, connecting these bits to VCC. The four least significant bits are provided to down counter 40 by "saturated" up/down counter 42. The term "saturated" counter is meant to refer to a counter in which the counter does not roll-over counting "up" from "1111" to "0000" or counting "down" from "0000" to "1111". If the range of frequencies generated by the controlled signal generator is large enough to accommodate any expected circuit tolerance, this "saturation" feature is not required. Otherwise, it prevents possible unwanted "limit cycles" in the controlled signal generator. The circuit operates as follows. Frequency discriminator 30 compares the frequency provided by reference clock oscillator 16 with the frequency provided on output 18 of down counter 40 which is the carry out output of the counter. Down counter 40 is clocked by the clock signal provided by on-chip oscillator 12. Down counter 40 is preloaded with a value from which it will count down by signals provided on bit lines $J_0$–$J_6$ (preset bits of counter 40).

Frequency discriminator 30 provides an up/down signal on connection 44 which directs counter 42 to either count up or down depending on the polarity of this signal. If frequency discriminator 30 determines that the frequency of the clock signal provided on output 18 is less than the frequency of reference clock signal 26, the up/down signal will direct counter 42 to count down. If, on the other hand, the frequency of the clock signal provided by reference clock oscillator 16 is less than the frequency of the clock signal on output 18, the up/down signal on line 44 will direct up/down counter 42 to count up. As a result, in response to a clock signal provided on line 46 to the clock input of up/down counter 42, up/down counter 42 will either increase or decrease the value of the four least significant bits provided to down counter 40. If the value of the least significant bits is increased, the down counter will generate a carry out output at a lower frequency so as to decrease the frequency of the clock provided on output 18. On the other hand, if the value of the least significant bits is decreased, than down counter 40 will generate a carry out output at a higher frequency so as to increase the frequency of the clock signal provided on output 18.

Down counter 40 is clocked by the clock signal provided by on-chip oscillator 12.

Each time down counter 40 generates a carry out output, this output is used to activate the load control input of down counter 40 so as to reload the counter and restart the countdown process.

Figure 5:
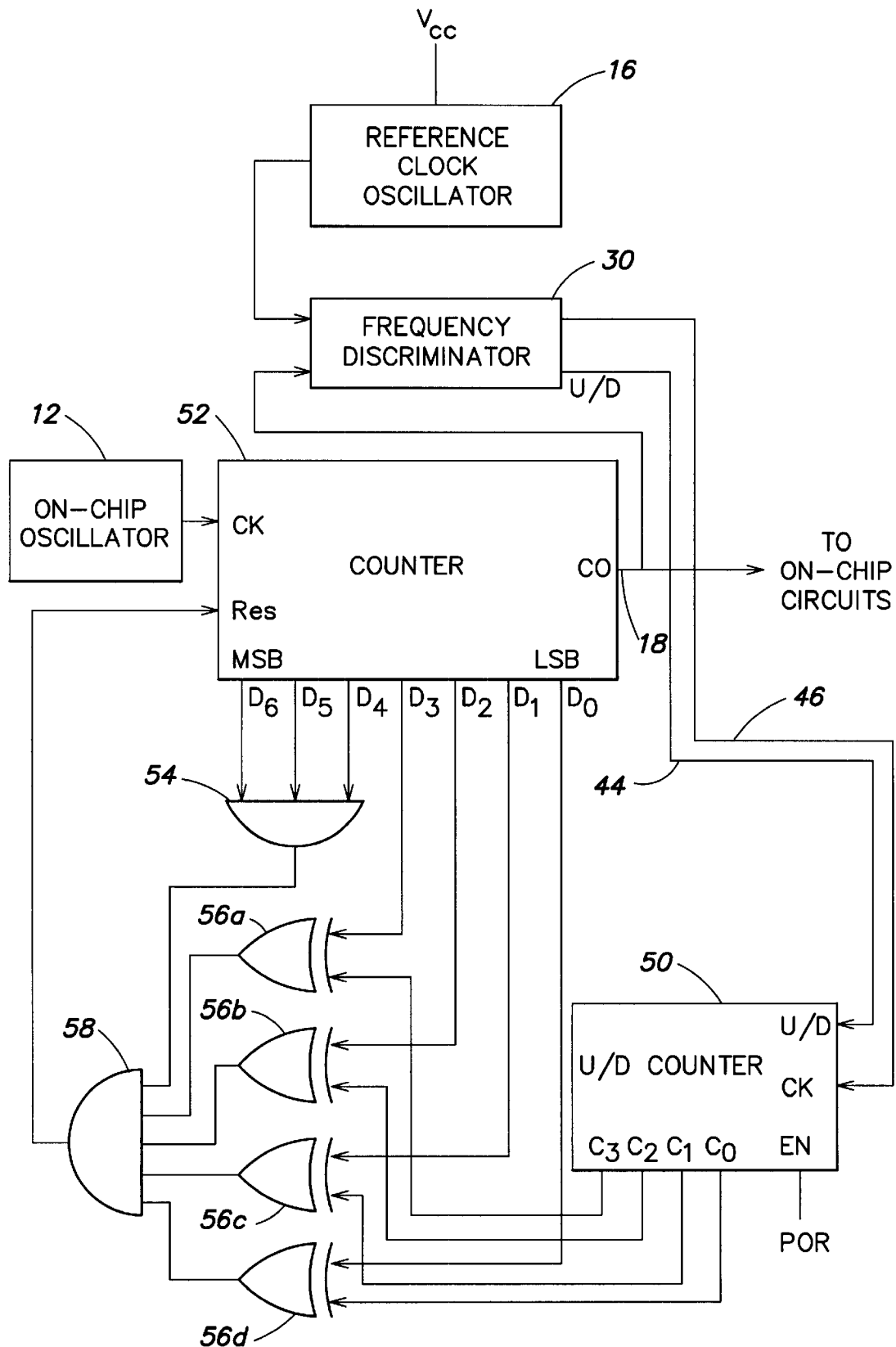
FIG. 5 illustrates another embodiment of the controlled signal generator of FIG. 3.

Reference is made to FIG. 5, which figure illustrates another embodiment of controlled signal generator 32 illustrated in FIG. 3. As with the embodiment of FIG. 4, the embodiment of FIG. 5 includes an up/down counter 50 and a counter 52. However, counter 52 counts up rather than down, and up/down counter 50 is not a saturated counter. The counter 52 has output bits $D_0$–$D_6$. In response to the up/down signal from frequency discriminator 30, up/down counter 50 either increases or decreases the value of least significant bits $C_0$–$C_3$. If the frequency of the clock signal provided by reference clock oscillator 16 is greater than the frequency of the clock signal on output 18 provided by the carry out output of counter 52, up/down counter 50 will count down to increase the value of the least significant bits $C_0$–$C_3$. This will in turn cause counter 52, which is clocked by the clock signal provided by on-chip oscillator 12, to reach its maximum count more quickly to thereby generate a carry out output at a higher frequency, thus causing the clock frequency provided on output 18 to increase. By contrast, if the frequency of the clock signal provided by reference clock 16 is lower than the frequency of the clock signal provided on output 18, the up/down signal provided by frequency discriminator 30 will direct up/down counter 50 to count up in response to a clock signal provided on line 46 to the clock input of counter 50. This will increase the value of the least significant bits $D_0$–$D_3$ which in turn causes counter 52 to reach its maximum count and generate a carry out signal at a lower frequency so as to move the frequency of the clock signal provided on output 18 towards the frequency of the clock signal provided by reference clock oscillator 16. LSB output bits $D_0$–$D_3$ of counter 52 are compared to the value stored in up/down counter 50 by exclusive OR gates 56A–56D. A reset of up counter 52 is generated by AND gate 54 when the count is reached at which all MSB's $D_4$–$D_6$ are high (or other predetermined value) and LSB's $D_0$–$D_3$ are equal to the value stored in up/down counter 50 bits $C_0$–$C_3$. The reset signal or an appropriate Carry Out signal CO can be utilized as output frequency 18.

The embodiments illustrated in FIGS. 4 and 5 illustrate a system in which the clock signal provided on output 18 varies by no more than one least significant bit with respect to the frequency of the clock signal provided by reference clock oscillator 16.

As an example, the frequency of the clock signal provided by on-chip oscillator 12 may vary by plus or minus five percent. This requires that the "range of adjustability" be at least ten percent of the full count, and therefore the "MSB's" can be at most three. If we want to achieve a final tolerance of plus or minus one percent between the output frequency and the reference frequency, then the "LSB" must be less than one percent of the total count, i.e., the total number of bits (MSB's plus LSB's) must be at least seven. Therefore, the counters of the controlled signal generators illustrated in FIGS. 4 and 5 are seven bits. However, one skilled in the art will appreciate that counters using a different number of bits and different up/down counters can be used depending upon the particular application and the tolerance necessary. When VCC is turned off in the embodiments of FIGS. 4 and 5, the power on reset signal POR is asserted which disables up/down counters 42 and 50, respectively. At that time, the magnitude of a count value provided by bits $C_0$–$C_3$ is fixed and therefore the frequency of the clock signal provided on output 18 by the carry out output of down counter 40 or counter 52 remains the same and thus the clock frequency is maintained.

One skilled in the art will appreciate that the frequency of the clock signal provided by reference clock oscillator 16 or the frequency of the clock signal provided by on-chip oscillator 12 may be divided down before these frequencies are provided to the illustrated circuits.

Convergence between the on-chip clock frequency and the reference clock frequency is provided in the illustrated embodiments by adding or subtracting a predetermined number of bits from the count, but other convergence schemes, such as proportional convergence where a portion of the difference between the signals is used to converge the signal together could also be used.

The illustrated circuits can provide variable division of the frequency of the clock signal provided by on-chip oscillator 12 so that the frequency provided by the frequency locked loop 14 is the same as or with a predetermined error band or tolerance of the clock frequency provided by reference clock oscillator 16. The error band between the frequency of the reference clock signal and the internal clock signal is programmable and can be changed by increasing or decreasing the number of bits in the up/down counter.

Although the present invention has been discussed in connection with its use in power down operations of hard disk drives, the concept can be applied to other types of circuits where a clock signal needs to be maintained to allow orderly, selective power down of circuits. The present invention can be used to selectively power down circuits for purposes of reducing power consumption.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit that synchronizes an output clock signal to a second clock signal, comprising:
   a frequency locked loop circuit that receives the output clock signal and the second clock signal, modifies a frequency of the output clock signal in response to a difference in frequency between the output clock signal and the second clock signal to provide an output clock signal having a frequency within a predetermined error band of the frequency of the second clock signal and wherein the frequency locked loop continues to provide the output clock signal in the absence of the second clock signal;
   wherein the frequency locked loop circuit includes a frequency discriminator and a controlled signal generator; and
   wherein the controlled signal generator includes a down counter that provides the output clock signal and a saturated up/down counter, the saturated up/down counter receiving a signal from the frequency discriminator and providing a signal to the down counter.

2. The circuit of claim 1, wherein the output clock signal remains constant in response to a signal generated at power-down of the second clock signal.

3. The circuit of claim 1, wherein the second clock signal is provided by a quartz crystal oscillator.

4. The circuit of claim 1, further including a first clock signal provided to the down counter by a resistor/capacitor oscillator circuit.

5. The circuit of claimed wherein the frequency discriminator compares the frequency of the second clock signal with the frequency of the output clock signal and provides a signal indicative of the difference between the frequency of the second clock signal and the frequency of the output clock signal.

6. The circuit of claim 5, wherein the controlled signal generator responds to the frequency discriminator to increase the frequency of the output clock signal if the frequency of the second clock signal is greater than the frequency of the output clock signal.

7. The circuit of claim 5, wherein the controlled signal generator responds to the frequency discriminator to decrease the frequency of the output clock signal if the frequency of the second clock signal is less than the frequency of the output clock signal.

8. The circuit of claim 1, wherein the predetermined error band is less than or equal to one percent of the second clock signal.

9. The circuit of claim 1, wherein the circuit is incorporated into a motor controller for a hard disk drive.

10. The circuit of claim 3, wherein the quartz crystal oscillator is powered by a first power supply and wherein the frequency locked loop continues to provide the output clock signal when the first power supply no longer operates.

11. A circuit that synchronizes an output clock signal to a second clock signal, comprising:
    a frequency locked loop circuit that receives the output clock signal and the second clock signal, modifies a frequency of the output clock signal in response to a difference in frequency between the output clock signal and the second clock signal to provide an output clock signal having a frequency within a predetermined error band of the frequency of the second clock signal and wherein the frequency locked loop continues to provide the output clock signal in the absence of the second clock signal;
    wherein the frequency locked loop circuit includes a frequency discriminator and a controlled signal generator; and
    wherein the controlled signal generator includes a counter that provides the output clock signal and an up/down counter, the up/down counter receiving a signal from the frequency discriminator and providing a signal to the down counter.

12. The circuit of claim 11, wherein the output clock signal remains constant in response to a signal generated at power-down of the second clock signal.

13. The circuit of claim 11, wherein the second clock signal is provided by a quartz crystal oscillator.

14. The circuit of claim 11, further including a first clock signal provided to the down counter by a resistor/capacitor oscillator circuit.

15. The circuit of claim 11, wherein the frequency discriminator compares the frequency of the second clock signal with the frequency of the output clock signal and provides a signal indicative of the difference between the frequency of the second clock signal and the frequency of the output clock signal.

16. The circuit of claim 15, wherein the controlled signal generator responds to the frequency discriminator to increase the frequency of the output clock signal if the frequency of the second clock signal is greater than the frequency of the output clock signal.

17. The circuit of claim 15, wherein the controlled signal generator responds to the frequency discriminator to decrease the frequency of the output clock signal if the frequency of the second clock signal is less than the frequency of the output clock signal.

18. The circuit of claim 11, wherein the predetermined error band is less than or equal to one percent of the second clock signal.

19. The circuit of claim 11, wherein the circuit is incorporated into a motor controller for a hard disk drive.

20. The circuit of claim 13, wherein the quartz crystal oscillator is powered by a first power supply and wherein the frequency locked loop continues to provide the output clock signal when the first power supply no longer operates.

21. A disk drive system; comprising:
    a hard disk drive; and
    a motor controller coupled to and controlling the hard disk drive, the motor controller comprising a circuit that synchronizes an output clock signal to a second clock signal, the circuit comprising:
        a frequency locked loop circuit that receives the output clock signal and the second clock signal, modifies a frequency of the output clock signal in response to a difference in frequency between the output clock signal and the second clock signal to provide an output clock signal having a frequency within a predetermined error band of the frequency of the second clock signal and wherein the frequency locked loop continues to provide the output clock signal in the absence of the second clock signal;

wherein the frequency locked loop circuit includes a frequency discriminator and a controlled signal generator; and wherein the controlled signal generator includes a down counter that provides the output clock signal and a saturated up/down counter, the saturated up/down counter receiving a signal from the frequency discriminator and providing a signal to the down counter.

22. A disk drive system; comprising:

a hard disk drive; and a motor controller coupled to and controlling the hard disk drive, the motor controller comprising a circuit that synchronizes an output clock signal to a second clock signal, the circuit comprising:

a frequency locked loop circuit that receives the output clock signal and the second clock signal, modifies a frequency of the output clock signal in response to a difference in frequency between the output clock signal and the second clock signal to provide an output clock signal having a frequency within a predetermined error band of the frequency of the second clock signal and wherein the frequency locked loop continues to provide the output clock signal in the absence of the second clock signal;

wherein the frequency locked loop circuit includes a frequency discriminator and a controlled signal generator; and wherein the controlled signal generator includes a counter that provides the output clock signal and an up/down counter, the up/down counter receiving a signal from the frequency discriminator and providing a signal to the down counter.

* * * * *